United States Patent [19]

Yoshida et al.

[11] Patent Number: 4,891,816
[45] Date of Patent: Jan. 2, 1990

[54] INTEGRATED SEMICONDUCTOR LASER DEVICE

[75] Inventors: Toshihiko Yoshida, Tenri; Taiji Morimoto; Shinji Kaneiwa, both of Nara; Masahiro Yamaguchi, Tenri, all of Japan

[73] Assignee: Sharp Kabushiki Kaisha, Osaka, Japan

[21] Appl. No.: 205,446

[22] Filed: Jun. 10, 1988

[30] Foreign Application Priority Data

Jun. 30, 1987 [JP] Japan ................................ 62-164766

[51] Int. Cl.$^4$ .............................................. H01S 3/19
[52] U.S. Cl. ........................................ 372/50; 372/46
[58] Field of Search ............................ 372/45, 46, 50

[56] References Cited

U.S. PATENT DOCUMENTS 4,768,200  8/1988  Isshiki .................................. 372/46

FOREIGN PATENT DOCUMENTS 0280693  12/1986  Japan .................................... 372/50

Primary Examiner—James W. Davie
Attorney, Agent, or Firm—Irell & Manella

[57] ABSTRACT

An integrated semiconductor laser device comprising a plurality of semiconductor laser device elements, at least one of which has a means for preventing the injection of current in the vicinity of one facet or both facets.

2 Claims, 3 Drawing Sheets

Fig. 1a
Fig. 1b
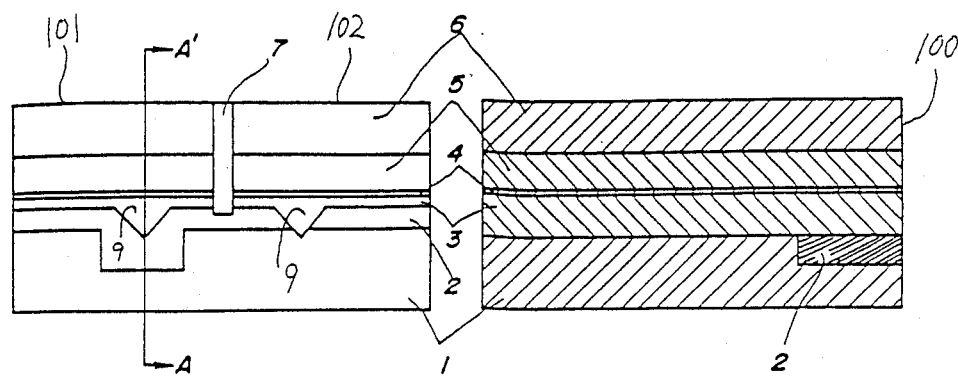
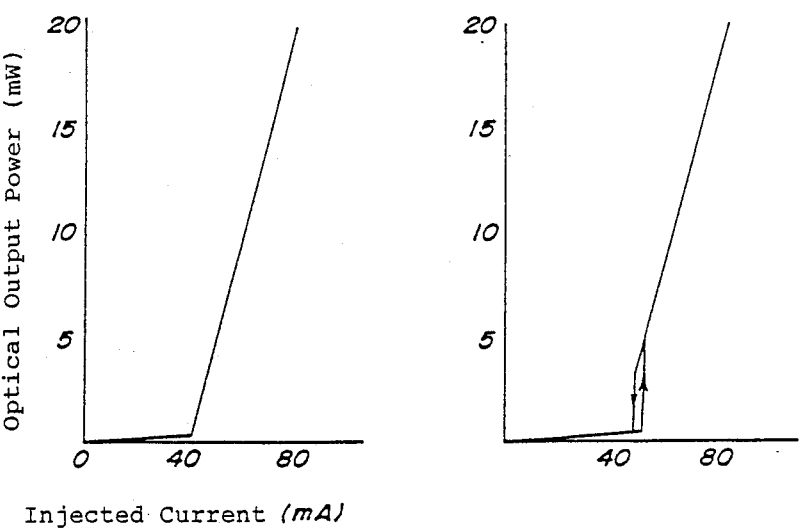
Fig. 3a
Fig. 3b

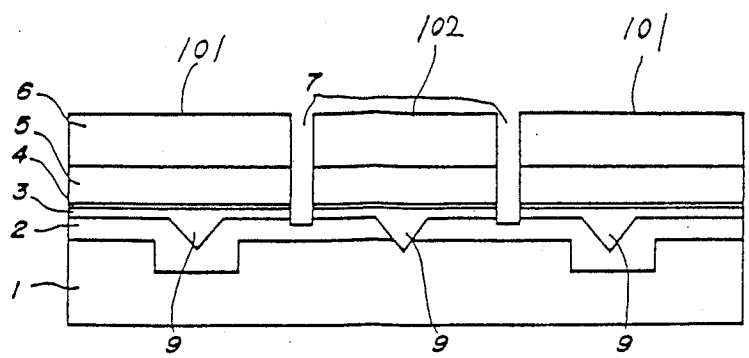
Fig. 5
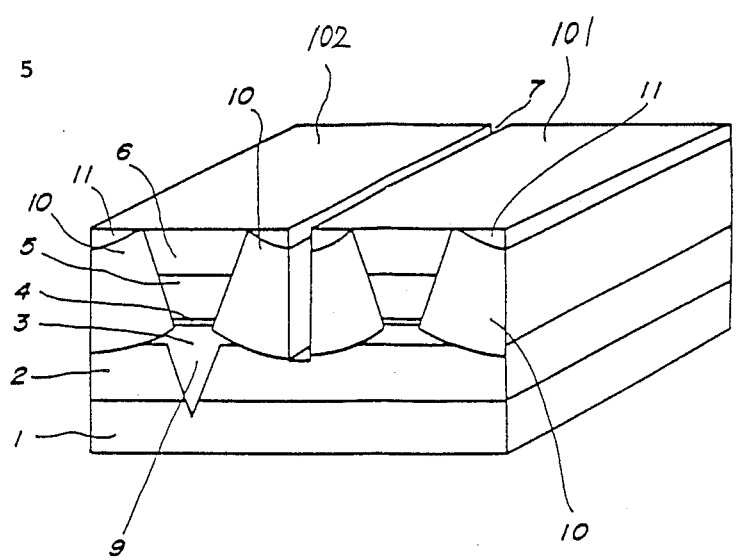
Fig. 6
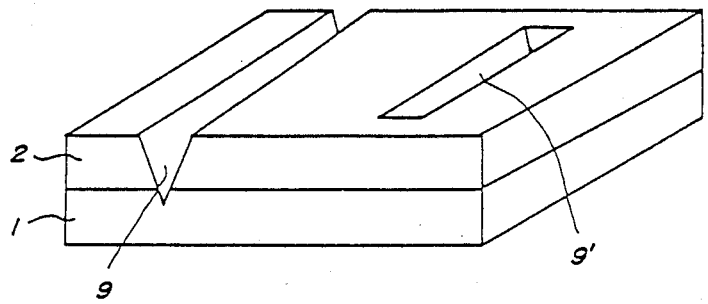

INTEGRATED SEMICONDUCTOR LASER DEVICE

BACKGROUND OF THE INVENTION

1. Field of the Invention

This invention relates to an integrated semiconductor laser device with a plurality of laser device elements, at least one of which has a portion for preventing the injection of current in the vicinity of one facet or both facets.

2. Description of the Prior Art

Semiconductor laser devices that are used as a light source for the optical pick up of a magnetooptical disc system or the like must operate at a low output power of about 3 mW at the time of reading of signals and at a high output power of 30 mW or more at the time of writing and erasing of signals. Moreover, upon writing of the signals, they must check on the written information. Accordingly, it is preferable that a high output power semiconductor laser device used for the writing of information and a low output power semiconductor laser device used for the reading of information are integrated in a single optical system. A plurality of the same semiconductor laser devices are generally produced at the same time by liquid phase epitaxy, metal organic-chemical vapor deposition, molecular beam epitaxy, or the like. However, when high output power semiconductor laser devices are produced, in order to prevent breakage of the facets thereof, the active layer must be made thin in the vicinity of the facets and/or layers with large energy gaps are required, which causes difficulties in the simultaneous production of these devices. Moreover, there are differences in optical characteristics such as astigmatism, light-emitting angles, or the like between the low output power semiconductor laser devices and the high output power semiconductor laser devices, so that both kinds of semiconductor laser devices cannot be used in the same optical system, causing difficulties in the integration thereof. To overcome this problem, high output power semiconductor laser devices are used as substitutes for low output power semiconductor laser devices, or high output power semiconductor laser devices and low output power semiconductor laser devices that are separately produced are mounted on a single stem. To operate a high output power semiconductor laser device at a low output power level is inefficient. Moreover, when the two laser devices that are separately produced are mounted on a single stem, the facets of one laser device must agree with those of the other laser device, which necessitates excessive technical skill.

SUMMARY OF THE INVENTION

The integrated semiconductor laser device of this invention, which overcomes the above-discussed and numerous other disadvantages and deficiencies of the prior art, comprises a plurality of semiconductor laser device elements, at least one of which has a means for preventing the injection of current in the vicinity of one facet or both facets.

In a preferred embodiment, the means for preventing the injection of current is composed of a current blocking layer that is made thicker in the vicinity of the facet than the current blocking layer of the inside of the facet.

Thus, the invention described herein makes possible the objectives of (1) providing an integrated semiconductor laser device that has high output power semiconductor laser device elements and low output power semiconductor laser device elements on the same substrate in such a manner that the facets of the former device elements agree with those of the latter device elements; and (2) providing an integrated semiconductor laser device that is used as a light source for the optical pick up of a magneto-optical disc system.

BRIEF DESCRIPTION OF THE DRAWINGS

This invention may be better understood and its numerous objects and advantages will become apparent to those skilled in the art by reference to the accompanying drawings as follows:

FIG. 1a is a front view showing an integrated semiconductor laser device of this invention.

FIG. 1b is a sectional view showing the integrated semiconductor laser device taken on line A—A' of FIG. 1a.

FIGS. 3a and 3b, respectively, are of characteristic curves showing the relationship between the injected current and the optical output power with regard to the low output power semiconductor laser device element and the high output power semiconductor laser device element of an integrated semicondcutor laser device of this invention.

FIG. 4 is a front view showing another integrated semiconductor laser device of this invention.

FIG. 5 is a perspective view showing another integrated semiconductor laser device of this invention.

FIG. 6 is a diagram showing the part of a production process of the integrated semiconductor laser device shown in FIG. 5.

DESCRIPTION OF THE PREFERRED EMBODIMENTS

Figure 2A:
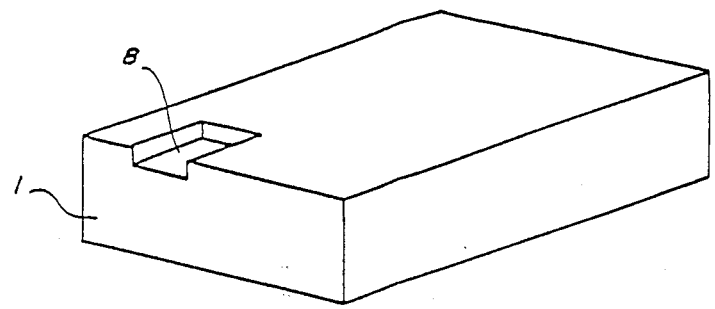
FIGS. 2a to 2c are diagrams showing a production process of the integrated semiconductor laser device shown in FIG. 1.
Figure 2B:
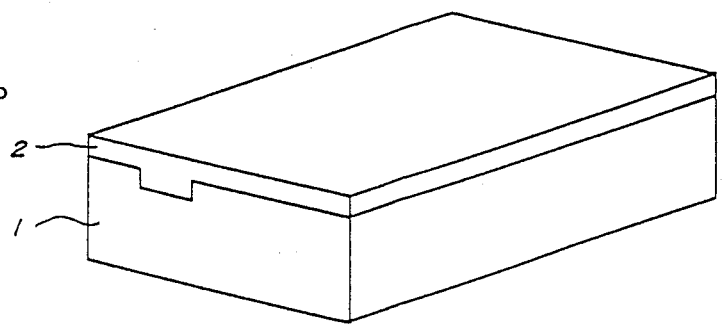
Figure 2C:
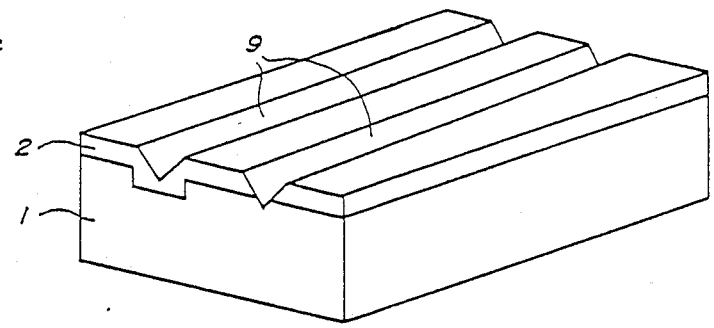

FIG. 1 shows an integrated semiconductor laser device of this invention, which is composed of a high output power semiconductor laser device element 101 having a thick current blocking layer 2 underneath a channel 9 in the vicinity of the facet 100 and a low output power semiconductor laser device element 102. This integrated semiconductor laser device is produced as follows: As shown in FIG. 2a, a concave section 8 having a width of 10 μm, a depth of 0.6 μm or more and a length of 10 μm or more is formed in the top of a p-GaAs substrate 1 by photolithography. Then, as shown in FIG. 2b, an n-GaAs current blocking layer 2 is formed on the substrate 1 in such a manner that the concave section 8 is filled with the n-GaAs and moreover the thickness of the n-GaAs current blocking layer formed over the portion of the substrate 1 other than the concave section 8 becomes 0.6 μm or more. Then, as shown in FIG. 2c, two channels 9 that function as current-injecting strips are formed in a parallel manner with a gap of 50 μm therebetween by photolithography in such a manner that one of the channels 9 is positioned on the above-mentioned concave section 8. The two channels 9 reach the substrate 1 through the current blocking layer 2, but the portion of the channel 9 positioned on the concave section 8 does not reach the substrate 1. Then, on the current blocking layer 2 including the channels 9, as shown in FIGS. 1a and 1b, a p-GaAlAs cladding layer 3, a p-GaAlAs active layer 4, an n-GaAlAs cladding layer 5, and an n-GaAs cap layer 6 are successively formed. The energy gap of the active layer 4 is smaller than those of the cladding layers 3 and 5. The resulting multi-layered wafer is cleaved in such a manner that one end of the concave section 8 agrees with one of the cleaved faces of the said wafer, resulting in a semiconductor laser device unit with a cavity length of 250 μm. Then, electrodes (not shown) are formed on the upper face of the epilayer and the bottom face of the substrate, after which a groove 7 by which the laser-oscillating area of the high output power semiconductor laser device element 101 and the laser-oscillating area of the low output power semiconductor laser device element 102 are electrically separated from each other is formed by an etching technique.

FIG. 3a shows a characteristic curve of the relationship between the injected current and the optical output power with regard to the low output power semiconductor laser device element 102 of the above-mentioned laser device. FIG. 3b shows a characteristic curve of the relationship between the injected current and the optical output power with regard to the high output power semiconductor laser device element 101 having an n-GaAs current blocking layer with a thick portion in the vicinity of the facet 100. FIG. 3b indicates that the high output power semiconductor laser device element exhibits the switching phenomenon at a low output power level, that the optical output power abruptly increases when a small amount of current is injected and also exhibits the hysteresis phenomenon at a low output power level, that the optical output power at the time when the injected current is increased is different at the same current level from the optical output power at the time when the injected current is decreased. This means that the high output power semiconductor laser device element is in an unstable oscillating state at a low output power level, so that it cannot be used for the reading of signals with small optical output. However, at the time of high output power operation, the said laser device element stably oscillates so that it can be used for writing and erasing of signals. Although conventional high output power semiconductor laser devices have the drawback that breakage tends to arise in the vicinity of the facets at which the optical density is the highest and the heat-generation is most liable to occur, the high output power semiconductor laser device element of the integrated semiconductor laser device of this invention is advantageous in that current does not flow to the facet due to a thick current blocking layer, and accordingly, the heat-generation based on ineffective current that is not useful for laser oscillation can be prevented at the facet so that a stabilized operation can be attained for a long period of time at a high output power level. The length of the concave section 8 must be set at 10 μm or more so that current injected into the laser device can be effectively prevented from flowing to the facet.

FIG. 4 shows another integrated semiconductor laser device of this invention in which two high-output power semiconductor laser device elements 101 and one low-output power semiconductor laser device element 102 are incorporated into one body. One of the high output power semiconductor laser device elements 101 is used for writing of signals and the other is used for erasing the signals. When these device elements are disposed in the signal-tracking direction, it is possible to check up signals to be correct or wrong upon writing of the signals and it is also possible to erase the signals upon reading of the said signals. This integrated semiconductor laser device is produced in the same way as that of FIG. 1.

FIG. 5 shows another integrated semiconductor laser device of this invention, which is of a buried typed. As shown in FIG. 6, an n-GaAs current blocking layer 2is formed on a p-GaAs substrate 1. Then, two channels 9 and 9' are formed in a parallel manner by photolithography so that they can reach the substrate 1 through the current blocking layer 2. One channel 9 is formed from one facet of the laser device to the other facet thereof, whereas the other channel 9' is formed inside of the facets of the laser device. Then, on the current blocking layer 2 including the channels 9 and 9' a p-GaAlAs cladding layer 3, a p-GaAlAs active layer 4, an n-GaAlAs cladding layer 5, and an n-GaAs cap layer 6 are successively formed. Then, two mesa-strips are formed by removing the areas outside of the said mesa-strips so as to reach the current blocking layer 2 by an etching technique in such a manner that they are positioned over the channels 9 and 9', respectively. Thereafter, an undoped GaAlAs layer 10 with high resistivity and an n-GaAs layer 11 that constitutes ohmic contact are successively formed outside of the mesa-strips, after which electrodes (not shown) are formed on the upper face of the epilayer and the bottom face of the substrate. Then, a groove 7 is formed to separate the laser-oscillating area of a high output power semiconductor laser device element 101 (including the channel 9') from the laser-oscillating area of a low output power semiconductor laser device element 102 (including the channel 9). This kind of semiconductor laser device can be also designed with three cavities such as those shown in FIG. 4.

Although the above-mentioned examples disclose GaAlAs/GaAs semiconductor laser devices alone, this invention is, of course, applicable to other compound semiconductors such as the InGaAsP/InP system or the like. The above-mentioned examples disclose that a means for preventing the injection of current is disposed in the vicinity of one facet, but the said means can be, of course, disposed in the vicinity of both facets.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An integrated semiconductor laser device comprising a single substrate and a plurality of semiconductor laser device elements that are disposed on said substrate, said plurality of semiconductor laser device elements being composed of high output power semiconductor laser device elements and low output power semiconductor laser device elements, wherein at least one of said plurality of semiconductor laser device elements includes means for preventing injection of current in the vicinity of one facet or both facets so as to form said high output power semiconductor laser device elements, said means for preventing the injection of current being composed of a current blocking layer that is made thicker in the vicinity of the facet than the current blocking layer of the inside of the facet, and said high output power semiconductor laser device elements and said low output power semiconductor laser device elements are disposed so that the facets of the former device elements agree with those of the latter device elements.

2. An integrated semiconductor laser device comprising a single substrate and a plurality of semiconductor laser device elements that are disposed on said substrate, said plurality of semiconductor laser device elements being composed of high output power semiconductor laser device elements and low output power semiconductor laser device elements, wherein at least one of said plurality of semiconductor laser device elements includes means for preventing injection of current in the vicinity of one facet or both facets so as to form said high output power semiconductor laser device elements, and said high output power semiconductor laser device elements and said low output power semiconductor laser device elements are disposed so that the facets of the former device elements agree with those of the latter device elements.

* * * * *